United States Patent
Wu et al.

(10) Patent No.: US 12,434,347 B2
(45) Date of Patent: Oct. 7, 2025

(54) METHOD FOR CMP TEMPERATURE CONTROL

(71) Applicant: Applied Materials, Inc., Santa Clara, CA (US)

(72) Inventors: Haosheng Wu, San Jose, CA (US); Shou-Sung Chang, Mountain View, CA (US); Chih Chung Chou, San Jose, CA (US); Jianshe Tang, San Jose, CA (US); Hui Chen, San Jose, CA (US); Hari Soundararajan, Sunnyvale, CA (US); Brian J. Brown, Palo Alto, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 18/537,574

(22) Filed: Dec. 12, 2023

(65) Prior Publication Data
US 2024/0109163 A1   Apr. 4, 2024

Related U.S. Application Data

(62) Division of application No. 16/989,734, filed on Aug. 10, 2020.

(60) Provisional application No. 62/886,260, filed on Aug. 13, 2019.

(51) Int. Cl.
| | |
|---|---|
| *B24B 37/015* | (2012.01) |
| *B24B 57/02* | (2006.01) |
| *H01L 21/321* | (2006.01) |
| *H01L 21/67* | (2006.01) |

(52) U.S. Cl.
CPC ............ *B24B 37/015* (2013.01); *B24B 57/02* (2013.01); *H01L 21/3212* (2013.01); *H01L 21/67248* (2013.01)

(58) Field of Classification Search
None
See application file for complete search history.

(56) References Cited

U.S. PATENT DOCUMENTS

| | | | |
|---|---|---|---|
| 4,450,652 | A | 5/1984 | Walsh |
| 4,919,232 | A | 4/1990 | Lofton |
| 5,088,242 | A | 2/1992 | Lubbering et al. |
| 5,196,353 | A | 3/1993 | Sandhu et al. |
| 5,478,435 | A | 12/1995 | Murphy et al. |

(Continued)

FOREIGN PATENT DOCUMENTS

| | | |
|---|---|---|
| CN | 2206182 | 8/1995 |
| CN | 1537038 A | 10/2004 |

(Continued)

OTHER PUBLICATIONS

Machine Generated English Translation of JP2018001789A. Publshed Jan. 11, 2018. (Year: 2018).*

(Continued)

*Primary Examiner* — Sylvia MacArthur
(74) *Attorney, Agent, or Firm* — Fish & Richardson P.C.

(57) ABSTRACT

A chemical mechanical polishing system includes a platen to support a polishing pad having a polishing surface, a conduit having an inlet to be coupled to a gas source, and a dispenser coupled to the conduit and having a convergent-divergent nozzle suspended over the platen to direct gas from the gas source onto the polishing surface of the polishing pad.

13 Claims, 3 Drawing Sheets

(56) References Cited

U.S. PATENT DOCUMENTS

| | | |
|---|---|---|
| 5,597,442 A | 1/1997 | Chen et al. |
| 5,643,050 A | 7/1997 | Chen |
| 5,709,593 A | 1/1998 | Guthrie |
| 5,722,875 A | 3/1998 | Iwashita et al. |
| 5,738,574 A | 4/1998 | Tolles et al. |
| 5,762,544 A | 6/1998 | Zuniga et al. |
| 5,765,394 A | 6/1998 | Rhoades |
| 5,851,135 A | 12/1998 | Sandhu et al. |
| 5,851,846 A | 12/1998 | Matsui et al. |
| 5,868,003 A | 2/1999 | Simas et al. |
| 5,873,769 A | 2/1999 | Chiou et al. |
| 5,893,753 A | 4/1999 | Hempel, Jr. |
| 5,957,750 A | 9/1999 | Brunelli |
| 6,000,997 A | 12/1999 | Kao et al. |
| 6,012,967 A | 1/2000 | Satake et al. |
| 6,023,941 A | 2/2000 | Rhoades |
| 6,095,898 A | 8/2000 | Hennofer et al. |
| 6,121,144 A | 9/2000 | Marcyk et al. |
| 6,151,913 A | 11/2000 | Lewis et al. |
| 6,159,073 A | 12/2000 | Wiswesser et al. |
| 6,257,954 B1 | 7/2001 | Ng et al. |
| 6,257,955 B1 | 7/2001 | Springer et al. |
| 6,264,789 B1 | 7/2001 | Pandey et al. |
| 6,280,289 B1 | 8/2001 | Wiswesser et al. |
| 6,315,635 B1 | 11/2001 | Lin |
| 6,319,098 B1 | 11/2001 | Osterheld et al. |
| 6,399,501 B2 | 6/2002 | Birang et al. |
| 6,422,927 B1 | 7/2002 | Zuniga |
| 6,461,980 B1 | 10/2002 | Cheung et al. |
| 6,494,765 B2 | 12/2002 | Gitis et al. |
| 6,503,131 B1 | 1/2003 | Franklin et al. |
| 6,543,251 B1 | 4/2003 | Gasteyer, III et al. |
| 6,640,151 B1 | 10/2003 | Somekh et al. |
| 6,647,309 B1 | 11/2003 | Bone |
| 6,776,692 B1 | 8/2004 | Zuniga et al. |
| 6,829,559 B2 | 12/2004 | Bultman et al. |
| 6,887,132 B2 | 5/2005 | Kajiwara et al. |
| 6,896,586 B2 | 5/2005 | Pham et al. |
| 6,899,592 B1 | 5/2005 | Kojima et al. |
| 7,008,295 B2 | 3/2006 | Wiswesser et al. |
| 7,016,750 B2 | 3/2006 | Steinkirchner et al. |
| 7,189,140 B1 | 3/2007 | Shugru et al. |
| 7,196,782 B2 | 3/2007 | Fielden et al. |
| 7,201,634 B1 | 4/2007 | Naujok et al. |
| 7,822,500 B2 | 10/2010 | Kobayashi et al. |
| 8,133,756 B2 | 3/2012 | Park et al. |
| 8,172,641 B2 | 5/2012 | Ho et al. |
| 8,349,247 B2 | 1/2013 | Ueno |
| 8,398,463 B2 | 3/2013 | Bajaj |
| 8,439,723 B2 | 5/2013 | Marks et al. |
| 8,740,667 B2 | 6/2014 | Kodera et al. |
| 8,845,391 B2 | 9/2014 | Sone et al. |
| 9,005,999 B2 | 4/2015 | Xu et al. |
| 9,067,296 B2 | 6/2015 | Ono et al. |
| 9,459,825 B2 | 10/2016 | Tahan |
| 9,475,167 B2 | 10/2016 | Maruyama et al. |
| 9,539,699 B2 | 1/2017 | Shinozaki |
| 9,579,768 B2 | 2/2017 | Motoshima et al. |
| 9,630,295 B2 | 4/2017 | Peng et al. |
| 9,782,870 B2 | 10/2017 | Maruyama et al. |
| 10,035,238 B2 | 7/2018 | Maruyama et al. |
| 11,103,970 B2 | 8/2021 | Huang et al. |
| 2001/0021625 A1 | 9/2001 | Inoue et al. |
| 2001/0055940 A1 | 12/2001 | Swanson |
| 2002/0039874 A1 | 4/2002 | Hecker et al. |
| 2002/0058469 A1 | 5/2002 | Pinheiro et al. |
| 2002/0065002 A1 | 5/2002 | Handa et al. |
| 2002/0065022 A1 | 5/2002 | Iwasaki et al. |
| 2002/0068454 A1 | 6/2002 | Sun et al. |
| 2003/0055526 A1 | 3/2003 | Avanzino et al. |
| 2003/0148615 A1 | 8/2003 | Chung et al. |
| 2003/0211816 A1 | 11/2003 | Liu et al. |
| 2004/0087248 A1 | 5/2004 | Hirokawa |
| 2005/0024047 A1 | 2/2005 | Miller et al. |
| 2005/0042877 A1 | 2/2005 | Salfelder et al. |
| 2005/0181709 A1 | 8/2005 | Jiang et al. |
| 2005/0211377 A1 | 9/2005 | Chen et al. |
| 2006/0205323 A1 | 9/2006 | Togawa et al. |
| 2007/0035020 A1 | 2/2007 | Umemoto |
| 2007/0135020 A1 | 6/2007 | Nabeya |
| 2007/0205112 A1 | 9/2007 | Kodera et al. |
| 2007/0227901 A1 | 10/2007 | Hu et al. |
| 2007/0238395 A1 | 10/2007 | Kimura et al. |
| 2008/0132152 A1 | 6/2008 | Kiesel et al. |
| 2008/0311823 A1 | 12/2008 | Aiuoshizawa et al. |
| 2009/0258573 A1 | 10/2009 | Muldowney et al. |
| 2010/0047424 A1 | 2/2010 | Cousin et al. |
| 2010/0081360 A1 | 4/2010 | Xu et al. |
| 2010/0203806 A1 | 8/2010 | Kitakura et al. |
| 2010/0227435 A1 | 9/2010 | Park et al. |
| 2010/0279435 A1 | 11/2010 | Xu et al. |
| 2011/0081832 A1 | 4/2011 | Nakamura et al. |
| 2011/0159782 A1 | 6/2011 | Sone et al. |
| 2012/0034846 A1 | 2/2012 | Minamihaba et al. |
| 2012/0040592 A1 | 2/2012 | Chen et al. |
| 2012/0190273 A1 | 7/2012 | Ono et al. |
| 2012/0220196 A1 | 8/2012 | Maruyama et al. |
| 2013/0023186 A1 | 1/2013 | Motoshima et al. |
| 2013/0045596 A1 | 2/2013 | Eda et al. |
| 2013/0115855 A1* | 5/2013 | Kodera ............... B24B 37/044 451/7 |
| 2013/0210173 A1 | 8/2013 | Wu et al. |
| 2013/0331005 A1 | 12/2013 | Akifumi et al. |
| 2014/0024297 A1 | 1/2014 | Cahndraeskaran et al. |
| 2014/0187122 A1 | 7/2014 | Ishibashi |
| 2014/0251952 A1 | 9/2014 | Bajaj et al. |
| 2014/0261824 A1 | 9/2014 | Byers et al. |
| 2014/0315381 A1 | 10/2014 | Wang et al. |
| 2014/0323017 A1 | 10/2014 | Tang et al. |
| 2015/0024661 A1 | 1/2015 | Peng et al. |
| 2015/0079881 A1 | 3/2015 | Maruyama et al. |
| 2015/0196988 A1 | 7/2015 | Watanabe |
| 2015/0224621 A1 | 8/2015 | Motoshima et al. |
| 2015/0224623 A1 | 8/2015 | Xu et al. |
| 2016/0167195 A1 | 6/2016 | Diao et al. |
| 2016/0236318 A1 | 8/2016 | Choi et al. |
| 2017/0232572 A1 | 8/2017 | Brown |
| 2017/0232574 A1 | 8/2017 | Kim et al. |
| 2017/0301573 A1 | 10/2017 | Shibuya et al. |
| 2017/0361419 A1 | 12/2017 | Elkhatib et al. |
| 2018/0236631 A1 | 8/2018 | Eto et al. |
| 2018/0290263 A1 | 10/2018 | Sotozaki et al. |
| 2018/0337068 A1 | 11/2018 | Ota et al. |
| 2019/0126428 A1 | 5/2019 | Martuyama et al. |
| 2019/0143476 A1 | 5/2019 | Wu |
| 2019/0143477 A1 | 5/2019 | Baba et al. |
| 2019/0242644 A1 | 8/2019 | Kim |
| 2020/0001425 A1 | 1/2020 | Huang |
| 2020/0001426 A1 | 1/2020 | Soundararajan et al. |
| 2020/0001427 A1 | 1/2020 | Soundararajan et al. |
| 2020/0262024 A1 | 8/2020 | Chang et al. |
| 2021/0046602 A1 | 2/2021 | Wu et al. |
| 2021/0046603 A1 | 2/2021 | Wu et al. |
| 2021/0046604 A1 | 2/2021 | Wu et al. |
| 2023/0029290 A1 | 1/2023 | Soundararajan et al. |
| 2024/0066660 A1 | 2/2024 | Wu et al. |
| 2024/0109163 A1* | 4/2024 | Wu .................... H01L 21/3212 |

FOREIGN PATENT DOCUMENTS

| | | |
|---|---|---|
| CN | 1934208 | 3/2007 |
| CN | 1970232 | 5/2007 |
| CN | 101209528 | 7/2008 |
| CN | 101500721 | 8/2009 |
| CN | 102179757 | 9/2011 |
| CN | 102419603 | 4/2012 |
| CN | 102528651 | 7/2012 |
| CN | 103708714 | 4/2014 |
| CN | 103934747 | 7/2014 |
| CN | 107097145 | 8/2017 |
| CN | 107696361 | 2/2018 |
| CN | 207171777 | 4/2018 |
| JP | H07-040232 | 2/1995 |
| JP | H10-321570 | 12/1998 |

(56) References Cited

FOREIGN PATENT DOCUMENTS

| | | |
|---|---|---|
| JP | H11-033897 | 2/1999 |
| JP | H 11-277410 | 10/1999 |
| JP | 2003151942 A * | 5/2003 ......... C11D 11/0047 |
| JP | 2003-197586 | 7/2003 |
| JP | 2003-524299 A | 8/2003 |
| JP | 2003-257914 | 9/2003 |
| JP | 2004-202666 | 7/2004 |
| JP | 2004-306173 | 11/2004 |
| JP | 2005-311246 | 11/2005 |
| JP | 2007-000968 | 1/2007 |
| JP | 2007-035973 | 2/2007 |
| JP | 2007-073615 | 3/2007 |
| JP | 2007-73615 | 3/2007 |
| JP | 2007-168039 | 7/2007 |
| JP | 2008-270627 | 11/2008 |
| JP | 2008-307624 | 12/2008 |
| JP | 2008-307630 | 12/2008 |
| JP | 2010-042487 | 2/2010 |
| JP | 2010-245239 | 10/2010 |
| JP | 2011-136406 | 7/2011 |
| JP | 2012-148376 | 8/2012 |
| JP | 2012-176449 | 9/2012 |
| JP | 2013-022664 | 2/2013 |
| JP | 2013-042066 | 2/2013 |
| JP | 2013-099814 | 5/2013 |
| JP | 2013-099828 | 5/2013 |
| JP | 2014-138973 | 7/2014 |
| JP | 2014-188596 | 10/2014 |
| JP | 2015-044245 | 3/2015 |
| JP | 2015-131361 | 7/2015 |
| JP | 2017-536692 A | 12/2017 |
| JP | 2018-001789 | 1/2018 |
| JP | 2018-101738 | 6/2018 |
| JP | 2018-187724 | 11/2018 |
| JP | 2018-195738 | 12/2018 |
| JP | 2019-081241 | 5/2019 |
| KR | 10-2002-0039606 | 5/2002 |
| KR | 10-2004-0000067 | 1/2004 |
| KR | 10-2004-0035721 A | 4/2004 |
| KR | 10-2009-0046468 | 5/2009 |
| KR | 2010-0101379 | 9/2010 |
| KR | 10-2012-0084671 | 7/2012 |
| KR | 10-2013-0095626 A | 8/2013 |
| KR | 10-2014-0014119 A | 2/2014 |
| KR | 10-2015-0024781 | 3/2015 |
| KR | 10-2017-0073292 | 6/2017 |
| KR | 10-2020-0056015 | 5/2020 |
| TW | 501168 | 9/2002 |
| TW | 200416108 | 9/2004 |
| TW | 201729944 | 9/2017 |
| TW | 202000368 | 1/2020 |
| WO | WO 1990/013735 | 11/1990 |
| WO | WO-9423896 A1 * | 10/1994 ............ B24C 1/003 |
| WO | WO-9614139 A1 * | 5/1996 ............ B01D 47/10 |
| WO | WO 2000/058054 | 10/2000 |
| WO | WO 2002/017411 | 2/2002 |
| WO | WO 2006/043928 | 4/2006 |
| WO | WO 2014/113220 | 7/2014 |
| WO | WO 2017/049763 | 3/2017 |
| WO | WO-2018004922 A1 * | 1/2018 ............ F25J 1/0022 |
| WO | WO 2020/005749 | 1/2020 |

OTHER PUBLICATIONS

Machine Generated English Translation of JP2008270627A. Publshed Nov. 6, 2008. (Year: 2008).*
Banerjee et al., "Post CMP Aqueous and CO2 Cryogenic Cleaning Technologies for Low k and Copper Integration," CMPUG Symposium, Poster Abstract, Jan. 2015, 2 pages.
International Search Report and Written Opinion in International Appln. No. PCT/US2020/045667 dated Nov. 17, 2020, 12 pages.
Machine Generated English Translation of CN 207171777, Published on Apr. 3, 2018, 25 pages.
Office Action in Chinese Appln. No. 202080056838.6, dated Jul. 31, 2023, 11 pages (with English translation).
Office Action in Japanese Appln. No. 2022-507601, dated Oct. 10, 2023, 11 pages (with English translation).
Office Action in Korean Appln. No. 10-2022-7007838, dated Dec. 7, 2023, 11 pages (with English summary).
Office Action in Taiwanese Appln. No. 109126617, dated Aug. 8, 2023, 13 pages (with English summary and search report).
Sampurno et al., "Pad Surface Thermal Management during Copper Chemical Mechanical Planarization," Presented Oct. 1, 2015 at lie International Conference on Planarization/CMP Technology, Sep. 30, 2015-Oct. 2, 2015, Session D-4, Chandler, AZ, USA, 24 pages.
Search Report in Japanese Appln. No. 2022-507601, mailed on Apr. 11, 2023, 10 pages (with English translation).
Wu et al., "Pad Surface Thermal Management during Copper Chemical: Mechanical Planarization," ECS Journal of Solid State Science and Technology, Apr. 2015, 4(7):P206-12.
Office Action in Taiwanese Appln. No. 109126617, dated Apr. 26, 2024, 10 pages (with English search report).
Nagy et al., "The effect of pulse width modulation (PWM) frequency on the reliability of thermoelectric modules," Eighteenth International Conference on Thermoelectrics. Proceedings, ICT'99 (Cat. No.99TH8407), Baltimore, MD, USA, 1999, 123-125.
Office Action in Japanese Appln. No. 2024-019260, dated Mar. 25, 2025, 7 pages (with English translation).
Office Action in Taiwanese Appln. No. 114100541, mailed Mar. 25, 2025, 4 pages (English translation of Search Report).

* cited by examiner

METHOD FOR CMP TEMPERATURE CONTROL

CROSS-REFERENCE TO RELATED APPLICATIONS

This application is a divisional of U.S. application Ser. No. 16/989,734, filed Aug. 10, 2020, which claims priority to U.S. Application No. 62/886,260, filed on Aug. 13, 2019, the disclosures of which are incorporated by reference.

TECHNICAL FIELD

The present disclosure relates to chemical mechanical polishing (CMP), and more specifically to temperature control during chemical mechanical polishing.

BACKGROUND

An integrated circuit is typically formed on a substrate by the sequential deposition of conductive, semiconductive, or insulative layers on a semiconductor wafer. A variety of fabrication processes require planarization of a layer on the substrate. For example, one fabrication step involves depositing a filler layer over a non-planar surface and planarizing the filler layer. For certain applications, the filler layer is planarized until the top surface of a patterned layer is exposed. For example, a metal layer can be deposited on a patterned insulative layer to fill the trenches and holes in the insulative layer. After planarization, the remaining portions of the metal in the trenches and holes of the patterned layer form vias, plugs, and lines to provide conductive paths between thin film circuits on the substrate. As another example, a dielectric layer can be deposited over a patterned conductive layer, and then planarized to enable subsequent photolithographic steps.

Chemical mechanical polishing (CMP) is one accepted method of planarization. This planarization method typically requires that the substrate be mounted on a carrier head. The exposed surface of the substrate is typically placed against a rotating polishing pad. The carrier head provides a controllable load on the substrate to push it against the polishing pad. A polishing slurry with abrasive particles is typically supplied to the surface of the polishing pad.

SUMMARY

In one aspect, a chemical mechanical polishing system includes a platen to support a polishing pad having a polishing surface, a conduit having an inlet to be coupled to a gas source, and a dispenser coupled to the conduit and having a convergent-divergent nozzle suspended over the platen to direct gas from the gas source onto the polishing surface of the polishing pad.

Implementations of any of the above aspects may include one or more of the following features.

The gas can be air, nitrogen, carbon dioxide, argon, evaporated ethanol and/or evaporated isopropyl alcohol.

A controller can be configured to be coupled to the gas source and to cause the gas source to deliver the gas through the convergent-divergent nozzle onto the polishing surface during a selected step of a polishing operation. The controller can be configured to be coupled to the gas source and to cause the gas source to deliver the gas into the convergent-divergent nozzle at a rate of 0 to 1000 liters per minute.

An injector can have an inlet coupled to a liquid source and an outlet to deliver liquid from the liquid source into the convergent-divergent nozzles. The liquid can be water, ethanol, and/or isopropyl alcohol. The controller can be coupled to the liquid source and can be configured to cause the liquid source to deliver liquid into the convergent-divergent nozzle during a selected step of a polishing operation. The controller coupled to the liquid source can be configured to deliver the liquid at a rate of 0 to 300 milliliters per minute into the convergent-divergent nozzle. The controller coupled to the gas source can be configured to cause a flow rate of gas through the convergent-divergent nozzle to be such that the gas is cooled sufficiently to cause the liquid to freeze.

A controller coupled to the gas source can be configured to cause a flow rate of gas through the convergent-divergent nozzle to be such that the coolant gas is cooled from an initial temperature above 20° C. to below 20° C. The controller can be configured to cause a flow rate of gas through the convergent-divergent nozzle to be such that the coolant gas is cooled to below 0° C. The controller can be configured to cause a flow rate of gas through the convergent-divergent nozzle to be such that the coolant gas is cooled to −70 to −50° C.

In another aspect, a method of temperature control for a chemical mechanical polishing system includes delivering a gas from a gas source to a convergent-divergent nozzle, cooling the gas by flowing the gas through the convergent-divergent nozzle, and directing the cooled gas onto a polishing pad.

Implementations of any of the above aspects may include one or more of the following features.

The gas can be formed by chilling air, by evaporation of liquid nitrogen, by evaporation of liquid ethanol, by evaporation of liquid isopropyl alcohol, and/or by sublimation of dry ice.

The gas can enter the convergent-divergent nozzle at a flow rate of 0 to 1000 liters per minute.

Liquid can be injected into the convergent-divergent nozzle. The liquid can be water, ethanol, and/or isopropyl alcohol. The liquid can be injected into the convergent-divergent nozzle at a flow rate of 0 to 300 milliliters per minute. The liquid can be frozen into solid particles by exposure to the cooled gas.

The gas can be cooled from an initial temperature above 20° C. to below 20° C. The cooled gas can be dispensed onto the polishing pad at a temperature below 0° C. The cooled gas can be dispensed onto the polishing pad at a temperature between −70 to −50° C.

One or more of the following possible advantages may be realized.

Temperature of the polishing pad can be quickly and efficiently controlled. The temperature of the polishing pad can be controlled without contacting the polishing pad with a solid body, e.g., a heat exchange plate, thus reducing risk of contamination of the pad and defects. Temperature variation over a polishing operation can be reduced. This can improve predictability of the polishing process. Temperature variation from one polishing operation to another polishing operation can be reduced. This can improve wafer-to-wafer uniformity and improve repeatability of the polishing process. Temperature variation across a substrate can be reduced. This can improve within-wafer uniformity.

In particular, the temperature of the polishing pad can be lowered quickly and efficiently. For example, the temperature of the polishing pad surface can be lowered during one or more of the metal clearing, over-polishing, or conditioning steps of a polishing operation. This can reduce dishing and corrosion, and/or improve uniformity of pad asperity, thus improving polishing uniformity and extending the lifetime of the pad.

The details of one or more implementations are set forth in the accompanying drawings and the description below. Other aspects, features, and advantages will be apparent from the description and drawings, and from the claims.

DETAILED DESCRIPTION

Chemical mechanical polishing operates by a combination of mechanical abrasion and chemical etching at the interface between the substrate, polishing liquid, and polishing pad. During the polishing process, a significant amount of heat is generated due to friction between the surface of the substrate and the polishing pad. In addition, some processes also include an in-situ pad conditioning step in which a conditioning disk, e.g., a disk coated with abrasive diamond particles, is pressed against the rotating polishing pad to condition and texture the polishing pad surface. The abrasion of the conditioning process can also generate heat. For example, in a typical one minute copper CMP process with a nominal downforce pressure of 2 psi and removal rate of 8000 Å/min, the surface temperature of a polyurethane polishing pad can rise by about 30° C.

Both the chemical-related variables in a CMP process, e.g., as the initiation and rates of the participating reactions, and the mechanical-related variables, e.g., the surface friction coefficient and viscoelasticity of the polishing pad, are strongly temperature dependent. Consequently, variation in the surface temperature of the polishing pad can result in changes in removal rate, polishing uniformity, erosion, dishing, and residue. By more tightly controlling the temperature of the surface of the polishing pad during polishing, variation in temperature can be reduced, and polishing performance, e.g., as measured by within-wafer non-uniformity or wafer-to-wafer non-uniformity, can be improved.

A technique that could address these issues is to have a nozzle that directs coolant gas through a convergent-divergent (CD) nozzle onto the polishing pad. Suspended droplets of water can be added to the CD nozzle. The water can be cooled to form ice droplets that efficiently cool the polishing pad due to the latent heat of fusion of the ice droplets.

Figure 1:
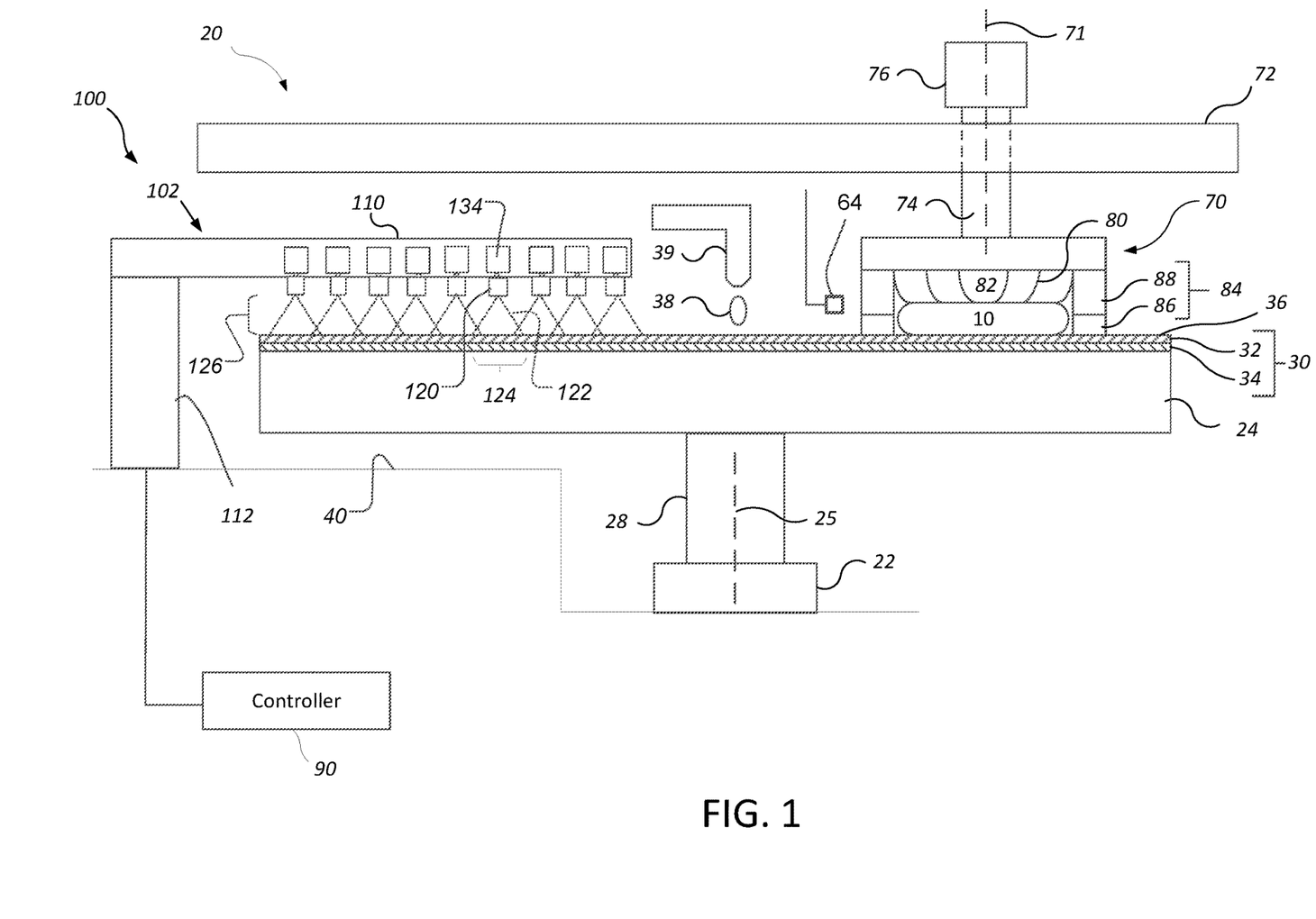
FIG. 1 illustrates a schematic cross-sectional view of an example of a polishing apparatus.
Figure 2:
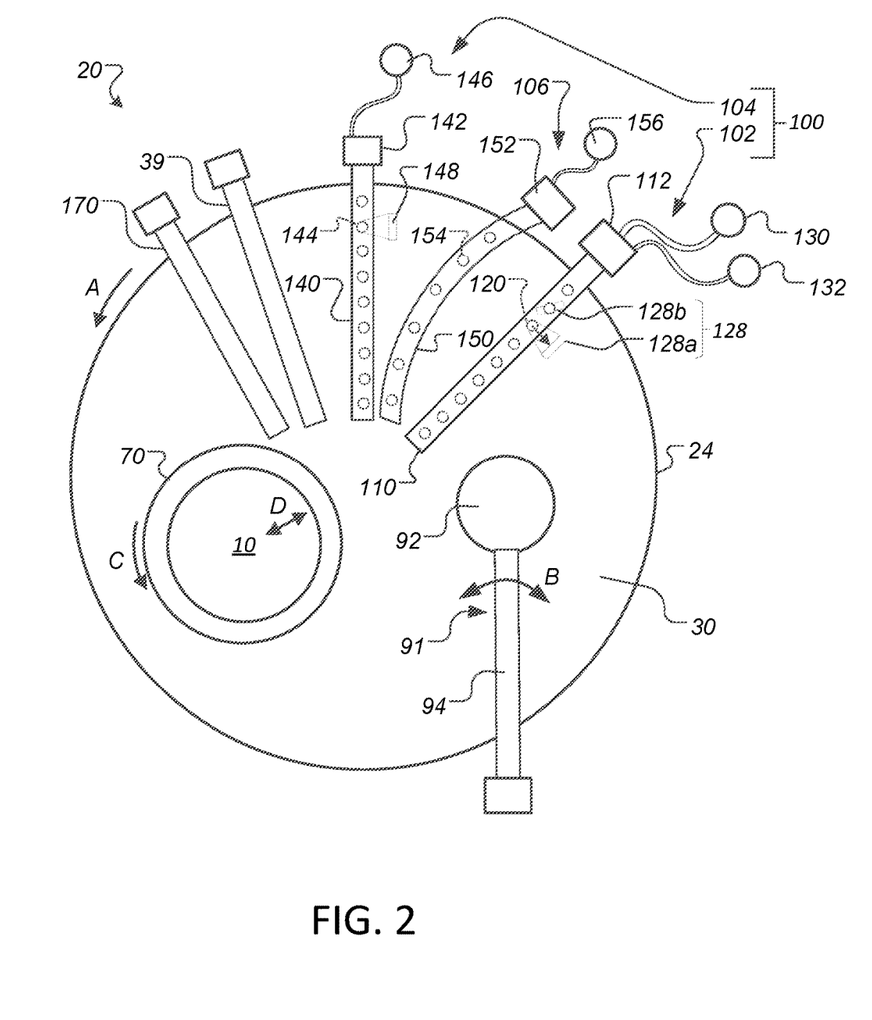
FIG. 2 illustrates a schematic top view of an example chemical mechanical polishing apparatus.

FIGS. 1 and 2 illustrate an example of a polishing station 20 of a chemical mechanical polishing system. The polishing station 20 includes a rotatable disk-shaped platen 24 on which a polishing pad 30 is situated. The platen 24 is operable to rotate (see arrow A in FIG. 2) about an axis 25. For example, a motor 22 can turn a drive shaft 28 to rotate the platen 24. The polishing pad 30 can be a two-layer polishing pad with an outer polishing layer 34 and a softer backing layer 32.

The polishing station 20 can include a supply port, e.g., at the end of a slurry supply arm 39, to dispense a polishing liquid 38, such as an abrasive slurry, onto the polishing pad 30. The polishing station 20 can include a pad conditioner apparatus 91 with a conditioning disk 92 (see FIG. 2) to maintain the surface roughness of the polishing pad 30. The conditioning disk 92 can be positioned at the end of an arm 94 that can swing so as to sweep the disk 92 radially across the polishing pad 30 (see arrows B in FIG. 2).

A carrier head 70 is operable to hold a substrate 10 against the polishing pad 30. The carrier head 70 is suspended from a support structure 72, e.g., a carousel or a track, and is connected by a drive shaft 74 to a carrier head rotation motor 76 so that the carrier head can rotate about an axis 71 (see arrow C in FIG. 2). Optionally, the carrier head 70 can oscillate laterally (see arrow D in FIG. 2), e.g., on sliders on the carousel, by movement along the track, or by rotational oscillation of the carousel itself.

The carrier head 70 can include a retaining ring 84 to hold the substrate. In some implementations, the retaining ring 84 may include a lower plastic portion 86 that contacts the polishing pad, and an upper portion 88 of a harder material.

In operation, the platen is rotated about its central axis 25, and the carrier head is rotated about its central axis 71 and translated laterally across the top surface of the polishing pad 30.

The carrier head 70 can include a flexible membrane 80 having a substrate mounting surface to contact the back side of the substrate 10, and a plurality of pressurizable chambers 82 to apply different pressures to different zones, e.g., different radial zones, on the substrate 10. The carrier head can also include a retaining ring 84 to hold the substrate.

In some implementations, the polishing station 20 includes a temperature sensor 64 to monitor a temperature in the polishing station or a component of/in the polishing station, e.g., the temperature of the polishing pad and/or slurry on the polishing pad. For example, the temperature sensor 64 could be an infrared (IR) sensor, e.g., an IR camera, positioned above the polishing pad 30 and configured to measure the temperature of the polishing pad 30 and/or slurry 38 on the polishing pad. In particular, the temperature sensor 64 can be configured to measure the temperature at multiple points along the radius of the polishing pad 30 in order to generate a radial temperature profile. For example, the IR camera can have a field of view that spans the radius of the polishing pad 30.

In some implementations, the temperature sensor is a contact sensor rather than a non-contact sensor. For example, the temperature sensor 64 can be thermocouple or IR thermometer positioned on or in the platen 24. In addition, the temperature sensor 64 can be in direct contact with the polishing pad.

In some implementations, multiple temperature sensors could be spaced at different radial positions across the polishing pad 30 in order to provide the temperature at multiple points along the radius of the polishing pad 30. This technique could be used in the alternative or in addition to an IR camera.

Although illustrated in FIG. 1 as positioned to monitor the temperature of the polishing pad 30 and/or slurry 38 on the pad 30, the temperature sensor 64 could be positioned inside the carrier head 70 to measure the temperature of the substrate 10. The temperature sensor 64 can be in direct contact (i.e., a contacting sensor) with the semiconductor wafer of the substrate 10. In some implementations, multiple temperature sensors are included in the polishing station 22, e.g., to measure temperatures of different components of/in the polishing station.

The polishing system 20 also includes a temperature control system 100 to control the temperature of the polishing pad 30 and/or slurry 38 on the polishing pad. The temperature control system 100 can include a cooling system 102 and/or a heating system 104. At least one, and in some implementations both, of the cooling system 102 and heating system 104 operate by delivering a temperature-controlled medium, e.g., a liquid, vapor or spray, onto the polishing surface 36 of the polishing pad 30 (or onto a polishing liquid that is already present on the polishing pad).

For the heating system 104, the heating medium can be a gas, e.g., steam or heated air, or a liquid, e.g., heated water, or a combination of gas and liquid. The medium is above room temperature, e.g., at 40-120° C., e.g., at 90-110° C. The medium can be water, such as substantially pure de-ionized water, or water that includes additives or chemicals. In some implementations, the heating system 104 uses a spray of steam. The steam can include additives or chemicals.

The heating medium can be delivered by flowing through apertures, e.g., holes or slots, e.g., provided by one or more nozzles, on a heating delivery arm. The apertures can be provided by a manifold that is connected to a source of the heating medium.

An example heating system 104 includes an arm 140 that extends over the platen 24 and polishing pad 30 from an edge of the polishing pad to or at least near (e.g., within 5% of the total radius of the polishing pad) the center of polishing pad 30. The arm 140 can be supported by a base 142, and the base 142 can be supported on the same frame 40 as the platen 24. The base 142 can include one or more actuators, e.g., a linear actuator to raise or lower the arm 140, and/or a rotational actuator to swing the arm 140 laterally over the platen 24. The arm 140 is positioned to avoid colliding with other hardware components such as the polishing head 70, pad conditioning disk 92, and the slurry dispensing arm 39.

Along the direction of rotation of the platen 24, the arm 140 of the heating system 104 can be positioned between the arm 110 of the cooling system 102 and the carrier head 70. Along the direction of rotation of the platen 24, the arm 140 of the heating system 104 can be positioned between the arm 110 of the cooling system 102 and the slurry delivery arm 39. For example, the arm 110 of the cooling system 102, the arm 140 of the heating system 104, the slurry delivery arm 39 and the carrier head 70 can be positioned in that order along the direction rotation of the platen 24.

Multiple openings 144 are formed in the bottom surface of the arm 140. Each opening 144 is configured to direct a gas or vapor, e.g., steam, onto the polishing pad 30. The arm 140 can be supported by a base 142 so that the openings 144 are separated from the polishing pad 30 by a gap. The gap can be 0.5 to 5 mm. In particular, the gap can be selected such that the heat of the heating fluid does not significantly dissipate before the fluid reaches the polishing pad. For example, the gap can be selected such that steam emitted from the openings does not condense before reaching the polishing pad.

The heating system 104 can include a source 146 of steam, which can be connected to the arm 140 by tubing. Each opening 144 can be configured to direct steam toward the polishing pad 30.

In some implementations, a process parameter, e.g., flow rate, pressure, temperature, and/or mixing ratio of liquid to gas, can be independently controlled for each nozzle. For example, the fluid for each opening 144 can flow through an independently controllable heater to independently control the temperature of the heating fluid, e.g., the temperature of the steam.

The various openings 144 can direct steam onto different radial zones on the polishing pad 30. Adjacent radial zones can overlap. Optionally, some of the openings 144 can be oriented so that a central axis of the spray from that opening is at an oblique angle relative to the polishing surface 36. Steam can be directed from one or more of the openings 144 to have a horizontal component in a direction opposite to the direction of motion of polishing pad 30 in the region of impingement as caused by rotation of the platen 24.

Although FIG. 2 illustrates the openings 144 as spaced at even intervals, this is not required. The nozzles 120 could be distributed non-uniformly either radially, or angularly, or both. For example, openings 144 could be clustered more densely toward the center of the polishing pad 30. As another example, openings 144 could be clustered more densely at a radius corresponding to a radius at which the polishing liquid 39 is delivered to the polishing pad 30 by the slurry delivery arm 39. In addition, although FIG. 2 illustrates nine openings, there could be a larger or smaller number of openings.

The polishing system 20 can also include a high pressure rinse system 106. The high pressure rinse system 106 includes a plurality of nozzles 154, e.g., three to twenty nozzles, that direct a cleaning fluid, e.g., water, at high intensity onto the polishing pad 30 to wash the pad 30 and remove used slurry, polishing debris, etc.

As shown in FIG. 2, an example rinse system 106 includes an arm 150 that extends over the platen 24 and polishing pad 30 from an edge of the polishing pad to or at least near (e.g., within 5% of the total radius of the polishing pad) the center of polishing pad 30. The arm 150 can be supported by a base 152, and the base 152 can be supported on the same frame 40 as the platen 24. The base 152 can include one or more actuators, e.g., a linear actuator to raise or lower the arm 150, and/or a rotational actuator to swing the arm 150 laterally over the platen 24. The arm 150 is positioned to avoid colliding with other hardware components such as the polishing head 70, pad conditioning disk 92, and the slurry dispensing arm 39.

Along the direction of rotation of the platen 24, the arm 150 of the rinse system 106 can be between the arm 110 of the cooling system 102 and the arm 140 of the heating system 104. For example, the arm 110 of the cooling system 102, the arm 150 of the rinse system 106, the arm 140 of the heating system 104, the slurry delivery arm 39 and the carrier head 70 can be positioned in that order along the direction of rotation of the platen 24. Alternatively, along the direction of rotation of the platen 24, the arm 140 of the cooling system 102 can be between the arm 150 of the rinse system 106 and the arm 140 of the heating system 104. For example, the arm 150 of the rinse system 106, the arm 110 of the cooling system 102, the arm 140 of the heating system 104, the slurry delivery arm 39 and the carrier head 70 can be positioned in that order along the direction of rotation of the platen 24.

Multiple nozzles 154 are suspended from the arm 150. Each nozzle 150 is configured to spray a cleaning liquid at high pressure onto the polishing pad 30. The arm 150 can be supported by a base 152 so that the nozzles 120 are separated from the polishing pad 30 by a gap. The rinsing system 106 can include a source 156 of cleaning fluid, which can be connected to the arm 150 by tubing.

The various nozzles 154 can spray onto different radial zones on the polishing pad 30. Adjacent radial zones can overlap. In some implementations, the nozzles 154 are oriented so that the regions of impingement of the cleaning liquid on the polishing pad do not overlap. For example, at least some nozzles 154 can be positioned and oriented so that regions of impingement are angularly separated.

At least some nozzles 154 can be oriented so that a central axis of the spray from that nozzle is at an oblique angle relative to the polishing surface 36. In particular, the cleaning fluid can be sprayed from each nozzle 154 with a horizontal component that is radially outward (toward the edge of the polishing pad). This can cause the cleaning fluid to slough off the pad 30 more quickly, and leave a thinner region of fluid on the polishing pad 30. This can thermal coupling between the heating and/or cooling media and the polishing pad 30.

Although FIG. 2 illustrate the nozzles 154 as spaced at even intervals, this is not required. In addition, although FIGS. 1 and 2 illustrate nine nozzles, there could be a larger or smaller number of nozzles, e.g., three to twenty nozzles.

In some implementations, the polishing system 20 includes a wiper blade or body 170 to evenly distribute the polishing liquid 38 across the polishing pad 30. Along the direction of rotation of the platen 24, the wiper blade 170 can be between the slurry delivery arm 39 and the carrier head 70.

FIG. 2 illustrates separate arms for each subsystem, e.g., the cooling system 102, heating system 104 and rinse system 106, various subsystems can be included in a single assembly supported by a common arm. For example, an assembly can include a cooling module, a rinse module, a heating module, a slurry delivery module, and optionally a wiper module. Each module can include a body, e.g., an arcuate body, that can be secured to a common mounting plate, and the common mounting plate can be secured at the end of an arm so that the assembly is positioned over the polishing pad 30. Various fluid delivery components, e.g., tubing, passages, etc., can extend inside each body. In some implementations, the modules are separately detachable from the mounting plate. Each module can have similar components to carry out the functions of the arm of the associated system described above.

For the cooling system 102, the cooling medium can be a gas, e.g., air, and/or a liquid, e.g., water. The gaseous component of the cooling medium, if present, can be air or another gas that is inert to the polishing process, such as nitrogen, carbon dioxide, argon, or another noble gas, or mixture thereof. The liquid component of the cooling medium, if present, can be water or another liquid such as ethanol, or isopropyl alcohol, or a mixture of thereof. The liquid component can be inert to the polishing process. The medium can be at room temperature or chilled below room temperature, i.e., below 20° C. For example, the medium can be at 5-15° C. In some implementations, the medium is at or below 0° C.

In some implementations, the medium is substantially pure gas. In some implementations, the cooling medium is a spray of gas and liquid, e.g., an aerosolized spray of liquid, such as water in a gas carrier, such as air. In some implementations, the cooling system can have nozzles that generate an aerosolized spray of water that is chilled below room temperature.

In some implementations, the coolant medium includes particles of solid material mixed with the gas and/or liquid. The solid material can be a chilled material, e.g., ice, dry ice, or frozen ethanol or isopropyl alcohol. In some implementations, the cooling medium is a spray of gas, e.g., air, and solid particles, e.g., ice particles, but substantially without liquid phase. The solid material can also be a material that absorbs heat by chemical reaction when dissolved in water.

The cooling medium can be delivered by flowing through one or more apertures, e.g., holes or slots, optionally formed in nozzles, in a coolant delivery arm. The apertures can be provided by a manifold that is connected to a coolant source.

As shown in FIGS. 1 and 2, an example cooling system 102 includes an arm 110 that extends over the platen 24 and polishing pad 30 from an edge of the polishing pad to or at least near (e.g., within 5% of the total radius of the polishing pad) the center of polishing pad 30. The arm 110 can be supported by a base 112, and the base 112 can be supported on the same frame 40 as the platen 24. The base 112 can include one or more actuators, e.g., a linear actuator to raise or lower the arm 110, and/or a rotational actuator to swing the arm 110 laterally over the platen 24. The arm 110 is positioned to avoid colliding with other hardware components such as the polishing head 70, pad conditioning disk 92, and the slurry dispenser 39.

The example cooling system 102 includes multiple nozzles 120 suspended from the arm 110. Each nozzle 120 is configured to spray a liquid coolant medium, e.g., water, onto the polishing pad 30. The arm 110 can be supported by a base 112 so that the nozzles 120 are separated from the polishing pad 30 by a gap 126.

Each nozzle 120 can be configured to start and stop fluid flow through each nozzle 120, e.g., using the controller 12. Each nozzle 120 can be configured to direct aerosolized water in a spray 122 toward the polishing pad 30. The cooling system 102 can include a source 130 of liquid coolant medium and a source 132 of gas coolant medium (see FIG. 2). Liquid from the source 130 and gas from the source 132 can be mixed in a mixing chamber 134 (see FIG. 1), e.g., in or on the arm 110, before being directed through the nozzle 120 to form the spray 122.

In some implementations, a process parameter, e.g., flow rate, pressure, temperature, and/or mixing ratio of liquid to gas, can be independently controlled for each nozzle (e.g., by the controller 12). For example, the coolant for each nozzle 120 can flow through an independently controllable chiller to independently control the temperature of the spray. As another example, a separate pair of pumps, one for the gas and one for the liquid, can be connected to each nozzle such that the flow rate, pressure and mixing ratio of the gas and liquid can be independently controlled for each nozzle.

The various nozzles can spray onto different radial zones 124 on the polishing pad 30. Adjacent radial zones 124 can overlap. In some implementations, the nozzles 120 generate a spray impinges the polishing pad 30 along an elongated region 128. For example, the nozzle can be configured to generate a spray in a generally planar triangular volume.

One or more of the elongated region 128, e.g., all of the elongated regions 128, can have a longitudinal axis parallel to the radius that extends through the region 128 (see region 128a). Alternatively, the nozzles 120 generate a conical spray.

Although FIG. 1 illustrates the spray itself overlapping, the nozzles 120 can be oriented so that the elongated regions do not overlap. For example, at least some nozzles 120, e.g., all of the nozzles 120, can be oriented so that the elongated region 128 is at an oblique angle relative to the radius that passes through the elongated region (see region 128b).

At least some nozzles 120 can be oriented so that a central axis of the spray (see arrow A) from that nozzle is at an oblique angle relative to the polishing surface 36. In particular, spray 122 can be directed from a nozzle 120 to have a horizontal component in a direction opposite to the direction of motion of polishing pad 30 (see arrow A) in the region of impingement caused by rotation of the platen 24.

Although FIGS. 1 and 2 illustrate the nozzles 120 as spaced at uniform intervals, this is not required. The nozzles 120 could be distributed non-uniformly either radially, or angularly, or both. For example, the nozzles 120 can clustered more densely along the radial direction toward the edge of the polishing pad 30. In addition, although FIGS. 1 and 2 illustrate nine nozzles, there could be a larger or smaller number of nozzles, e.g., three to twenty nozzles.

The cooling system 102 can be used to lower the temperature of the polishing surface 36. For example, the temperature of the polishing surface 36 can be lowered using liquid from the liquid coolant 130 via the spray 122 and/or gas from the gas coolant 132 via the spray 122. In some embodiments, the temperature of the polishing surface 36 can be lowered to at or below 20° C. Lower temperatures during one or more of metal clearing or over-polishing, steps can reduce dishing and erosion of the soft metals during CMP by reducing the selectivity of the polishing liquid 38.

Lower temperatures during CMP can be used to reduce corrosion. For example, lower temperatures during one or more of metal clearing, over-polishing, or conditioning steps could reduce galvanic corrosion in the various components, as galvanic reactions can be temperature-dependent. Additionally, during CMP inert gases can be used in the polishing process. In particular, a gas that lacks oxygen (or has lower oxygen than normal atmosphere) can be used to create a localized inert environment that reduces the oxygen in the localized inert environment, which can result in reduced corrosion. Examples of such gasses include nitrogen and carbon dioxide, e.g., evaporated from liquid nitrogen or dry ice.

Lowering the temperature of the polishing surface 36, e.g., for the conditioning step, can increase the storage modulus of the polishing pad 30 and reduce the viscoelasticity of the polishing pad 30. The increased storage modulus and reduced viscoelasticity, combined with a lower downforce on the pad conditioning disk 92 and/or less aggressive conditioning by the pad conditioning disk 92, can result in a more uniform pad asperity. An advantage to the uniform pad asperity is to reduce scratches on the substrate 10 during subsequent polishing operations, as well as increase the lifespan of the polishing pad 30.

Figure 3:
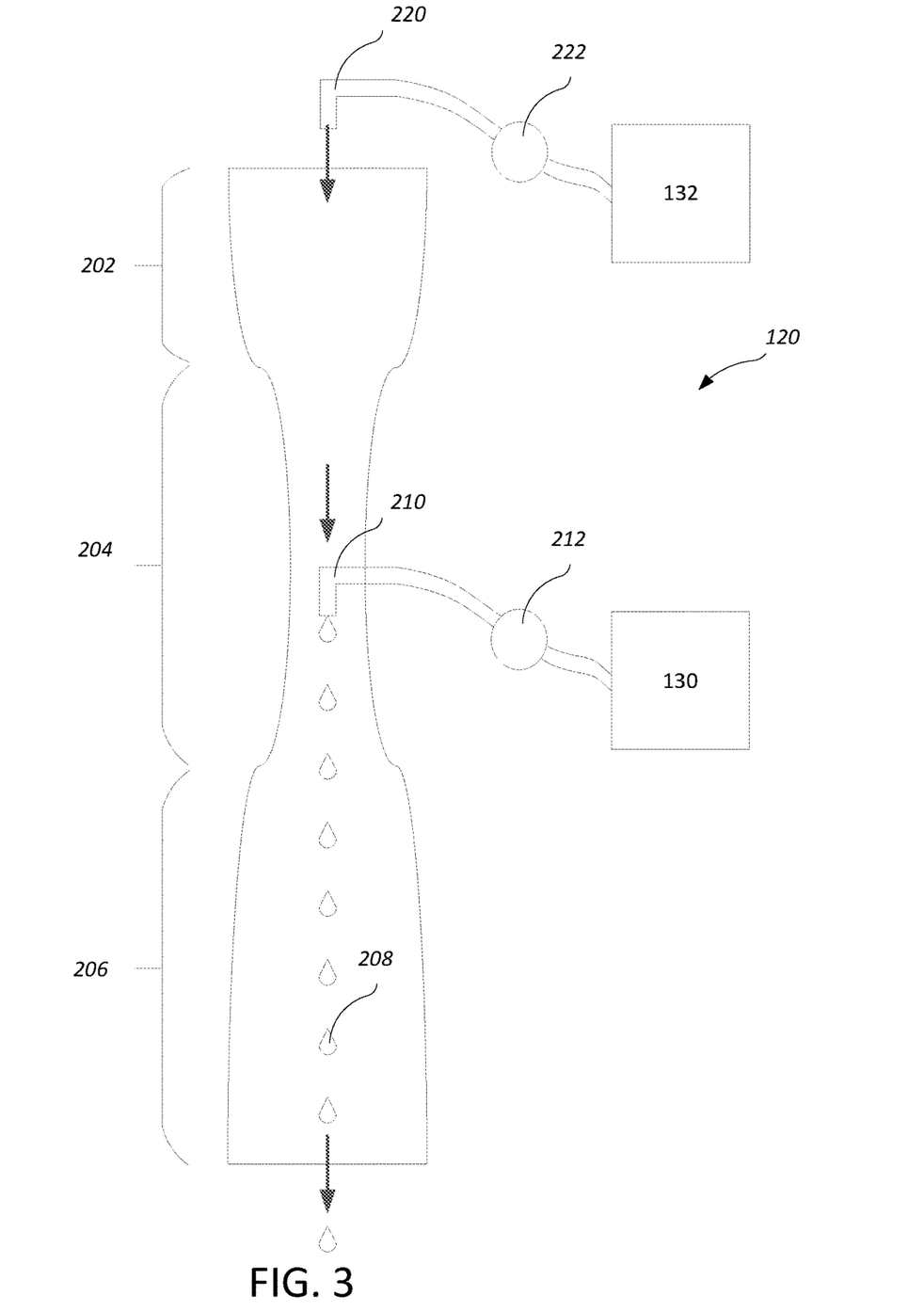
FIG. 3 illustrates a schematic cross-sectional view of an example nozzle from FIGS. 1 and 2.

Referring to FIG. 3, each nozzle 120 can be a convergent-divergent (CD) nozzle. The convergent-divergent (CD) nozzle can also described as a de Laval nozzle or supersonic nozzle. Each nozzle 120 has a convergent section 202 (e.g., an input port) where gas (e.g., gas from the gas source 132) enters the nozzle 120 at subsonic speeds. A pump 222 can direct gas from the gas source 132 and through a dispenser 220 into the CD nozzle 120. For example, gas entering the convergent section 202 can be at room temperature, e.g., 20-30° C., or below room temperature, and can enter at a rate of 0 to 1000 liters per minute per nozzle, e.g., 500 liters per minute per nozzle. From the convergent section 202, the gas enters a choke-point, or throat 204, where the cross-sectional area of the nozzle 120 is at its minimum. The velocity of the gas increases as it flows from the convergent section 202, through the throat 204 and to the divergent section 206 (e.g., an output port). The throat 204 causes the velocity of the gas flowing through the throat 204 to increase, so when the gas enters and exits the divergent section 206, the velocity of the gas is increased to supersonic speeds. For example, gas exiting the divergent section 206 can be at a temperature below room temperature, e.g., −100 to 20° C., −90 to 0° C., −80 to −25° C., or −70 to −50° C.

The gas used in the cooling system 102 can include, for example, air, nitrogen, carbon dioxide, argon, or evaporated gases such as vaporous ethanol or isopropyl alcohol. The gas can be cooled even before being delivered to the CD nozzle 120. For example, the cooled gas can be cold air (e.g., chilled by passing through a heat exchanger), cold nitrogen gas (e.g., from evaporation from liquid nitrogen), or cold carbon dioxide gas (e.g., from the sublimation of dry ice).

The CD nozzle 120 can be used to cool the polishing pad 30. For example, the divergent section 206 can dispense cooled gas directly onto the polishing pad 30. For example, the outlet from the divergent section 206 can be located about 1 to 10 cm from the polishing surface 36 and the nozzle 120 can be oriented so that the gas flow impinges the polishing surface.

In some implementations, the source 130 of liquid coolant medium can deliver liquid, e.g., water, through a dispenser 210. The dispenser 210 can be an injector positioned to inject water into the gas flow through the nozzle 120. For example, the injector 210 can be positioned to inject water droplets into the convergent section 202, into the throat 204 (as illustrated in FIG. 3), into the divergent section 206, or directly after the divergent section 206.

The flow rate of the liquid coolant into the gas flow, e.g., into the nozzle 120, can be controlled by a valve 212. The dispenser 210 can dispense water droplets 208, e.g., at a rate of 0 to 300 milliliters per minute, e.g., 3 to 50 milliliters per minute. The liquid flow rate can be about 0.001% to 1%, e.g., 0.01 to 0.1% of the gas flow rate. As gas flows through the CD nozzle 120, the water droplets 208 can be cooled by the gas as the gas flowing through the CD nozzle 120 are cooled. In some implementations, the water droplets 208 are cooled to form ice droplets. The ice droplets can be uniform in size, e.g., roughly 10 μm in diameter.

In some implementations, the water droplets 208 are also dispensed directly onto the polishing pad 30, which alongside the cooled gas, can further cool the polishing pad 30. Additionally, the ice or water droplets can prevent the polishing pad 30 from drying out as it is being cooled by the cooled gas. In some implementations, the cooled gas freezes the water droplets 208 to form ice droplets, which along with the cooled gas, can cool the polishing pad 30. The ice droplets can efficiently cool the polishing pad 30, as the latent heat of fusion can cool the polishing pad 30 as the ice droplets absorb heat and melt into water. Further, the ice droplets can be used to abrade and clean the polishing pad 30.

The above described polishing apparatus and methods can be applied in a variety of polishing systems. Either the polishing pad, or the carrier heads, or both can move to provide relative motion between the polishing surface and the substrate. For example, the platen may orbit rather than rotate. The polishing pad can be a circular (or some other shape) pad secured to the platen. The polishing layer can be a standard (for example, polyurethane with or without fillers) polishing material, a soft material, or a fixed-abrasive material.

Terms of relative positioning are used to refer to relative positioning within the system or substrate; it should be understood that the polishing surface and substrate can be held in a vertical orientation or some other orientation during the polishing operation.

The polishing system 20 can also include a controller 90 to control operation of various components, e.g., the temperature control system 100. The controller 90 is configured to receive the temperature measurements from the temperature sensor 64 for each radial zone of the polishing pad. The controller 90 can compare the measured temperature profile to a desired temperature profile, and generate a feedback signal to a control mechanism (e.g., actuator, power source, pump, valve, etc.) for each nozzle or opening. The feedback signal is calculated by the controller 90, e.g., based on an internal feedback algorithm, to cause the control mechanism to adjust the amount of cooling or heating such that the polishing pad and/or slurry reaches (or at least moves closer to) the desired temperature profile.

Functional operations of the controller 90 can be implemented using one or more computer program products, i.e., one or more computer programs tangibly embodied in a non-transitory computer readable storage media, for execution by, or to control the operation of, data processing apparatus, e.g., a programmable processor, a computer, or multiple processors or computers.

A number of embodiments of the invention have been described. Nevertheless, it will be understood that various modifications may be made without departing from the spirit and scope of the invention.

For example, although the description above focuses on delivering the heating and/or cooling medium onto the polishing pad, the heating and/or cooling medium could be delivered onto other components to control the temperature of those components. For example, a heating and/or cooling medium could be sprayed onto the substrate while the substrate is positioned in a transfer station, e.g., in a load cup. As another example, the load cup itself could be sprayed with the heating and/or cooling medium. As yet another example, the conditioning disk could be sprayed with the heating and/or cooling medium.

Accordingly, other embodiments are within the scope of the following claims.

What is claimed is:

1. A method of temperature control for a chemical mechanical polishing system, comprising:
   delivering a gas from a gas source to a convergent-divergent nozzle, wherein the gas is formed by evaporation of liquid ethanol, by evaporation of liquid isopropyl alcohol, or by sublimation of dry ice;
   cooling the gas from an initial temperature above 20° C. to below 0° C. by flowing the gas through the convergent-divergent nozzle;
   injecting a liquid through a sidewall of and into a throat of the convergent-divergent nozzle; and
   directing the cooled gas and liquid onto a polishing pad.

2. The method of claim 1, wherein the liquid is water.

3. The method of claim 1, wherein the liquid is ethanol, isopropyl alcohol, or both.

4. The method of claim 1, comprising freezing the liquid into solid particles by exposure to the cooled gas.

5. The method of claim 4, wherein the liquid freezes before impinging the polishing pad.

6. The method of claim 1, comprising cooling the gas from the initial temperature above 20° C. to below 20° C.

7. The method of claim 6, comprising dispensing the cooled gas onto the polishing pad at a temperature below 0° C.

8. The method of claim 7, comprising dispensing the cooled gas onto the polishing pad at a temperature between −70 to −50° C.

9. The method of claim 1, comprising flowing the gas into the convergent-divergent nozzle at a rate up to 1000 liters per minute.

10. The method of claim 1, flowing the liquid at a rate of up to 300 milliliters per minute into the convergent-divergent nozzle.

11. The method of claim 1, wherein a flow rate by volume of the liquid is 0.001% to 1% of a flow rate of the gas.

12. The method of claim 11, wherein the flow rate of the liquid is 0.01% to 0.1% of the flow rate of the gas.

13. A method of temperature control for a chemical mechanical polishing system, comprising:
    delivering a gas from a gas source to a convergent-divergent nozzle, wherein the gas is formed by evaporation of liquid nitrogen;
    cooling the gas from an initial temperature above 20° C. to below 0° C. by flowing the gas through the convergent-divergent nozzle;
    injecting a liquid through a sidewall of and into a throat of the convergent-divergent nozzle; and
    directing the cooled gas and liquid onto a polishing pad.

* * * * *